United States Patent [19]

Ohtoshi et al.

[11] Patent Number: 4,835,578
[45] Date of Patent: May 30, 1989

[54] SEMICONDUCTOR DEVICE HAVING A QUANTUM WIRE AND A METHOD OF PRODUCING THE SAME

[75] Inventors: Tsukuru Ohtoshi, Kokubunji; Kazuhisa Uomi, Hachioji; Tadashi Fukuzawa, Tokyo; Naoki Chinone, Chofu, all of Japan

[73] Assignee: Hitachi, Ltd., Tokyo, Japan

[21] Appl. No.: 139,791

[22] Filed: Dec. 30, 1987

[30] Foreign Application Priority Data

Jan. 16, 1987 [JP] Japan ................................. 62-6191

[51] Int. Cl.$^4$ .......................................... H01L 27/12
[52] U.S. Cl. ........................................ 357/4; 357/17; 357/55; 357/16
[58] Field of Search ................... 357/4 SL, 16, 55, 17

[56] References Cited

U.S. PATENT DOCUMENTS 4,701,774 10/1987 McIbroy .............................. 357/17
4,711,857 12/1987 Chong .................................. 357/4
4,731,789 3/1988 Thornton ............................. 357/4
4,733,282 3/1988 Chong .................................. 357/4

*Primary Examiner*—Martin H. Edlow
*Attorney, Agent, or Firm*—Antonelli, Terry & Wands

[57] ABSTRACT

A semiconductor device comprises a first superlattice layer consisting of a first semiconductor layer that contains impurities and a second semiconductor layer that contains impurities at a low concentration, said first superlattice layer being formed on a semiconductor substrate; and a second superlattice layer that covers that exposed side walls of said first superlattice layer. A disordered region is formed in the vicinity of the first semiconductor layer of the second superlattice layer in order to realize quantum wires with the conventional manufacturing process. This makes it possible to easily fabricate a laser device, a light-emitting diode and a transistor having quantum wires to enhance their performance.

7 Claims, 3 Drawing Sheets

SEMICONDUCTOR DEVICE HAVING A QUANTUM WIRE AND A METHOD OF PRODUCING THE SAME

BACKGROUND OF THE INVENTION

The present invention relates to a semiconductor device having a quantum wire that can be easily formed and that exhibits excellent characteristics, as well as to a method of producing the same.

Among the semiconductor devices, it can be theoretically expected that a quantum wire laser exhibits lower threshold value of oscillation and better temperature characteristics than those of the conventional double-heterostructure lasers and quantum well lasers. This has been mentioned in, for example, (1) M. Asada et al., Japanese Journal of Applied Physics, 24 (1985), L91, and (2) Y. Arakawa et al., Applied Physics Letters, 40 (1982), 939. Further, a built-in quantum wire without magnetic field has been reported in (3) P. M. Petroff et al., Applied Physics Letters, 41 (1982), 635. However, the structure for emitting light by the injection of carriers has not yet been known. None of the quantum wire light-emitting element of the type of carrier injection or the quantum wire device has yet been realized due to the fact that the thickness of the quantum wire element must be controlled to be smaller than de Broglie's wave length (about 200 angstroms) in both the direction of the film thickness and the direction perpendicular to the direction of the film thickness, involving great difficulty.

SUMMARY OF THE INVENTION

The object of the present invention is to provide a semiconductor device having a quantum wire that can be realized using the existing semiconductor process technology and to provide a method of producing the same.

The above object is accomplished by forming, on a predetermined semiconductor substrate, a modulation doped layer (doping superlattice) which consists of at least a highly doped semiconductor layer and an undoped (lowly doped) semiconductor layer, providing a superlattice layer on the side walls of the modulation doped layer, and causing the impurities in the highly doped semiconductor layer to diffuse toward the outside under high-temperatute conditions so that part of the superlattice provided on the side walls is disordered.

DETAILED DESCRIPTION OF THE PREFERRED EMBODIMENT

A semiconductor device having a quantum wire of the present invention is fabricated as described below.

(a) A first superlattice layer (modulation doped layer) is formed by alternatingly laminating a first semiconductor layer which is a highly doped semiconductor layer and a second semiconductor layer which is a lowly doped or undoped semiconductor layer on a semiconductor substrate.

(b) The layers are partly and vertically removed by etching from the surface of the first superlattice layer through up into the substrate.

(c) The side surfaces exposed by etching are covered with a second superlattice layer.

(d) Impurities in the first semiconductor layer of the first superlattice layer are caused to diffuse toward the external side under high-temperature conditions in order to disorder the vicinity of the first semiconductor layer of the second superlattice layer.

EMBODIMENT 1

Figure 1:
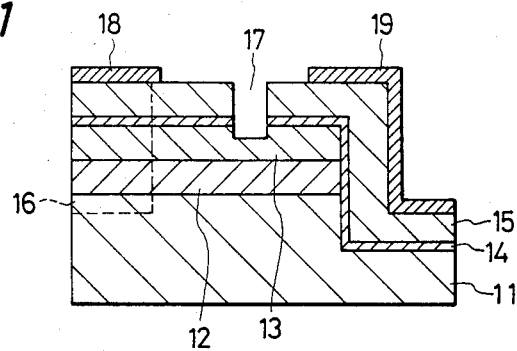
FIG. 1 is a section view illustrating the structure of a laser device according to a first embodiment of the present invention.

FIG. 1 is a section view illustrating a semiconductor device according to a first embodiment of the present invention, and FIGS. 2A to 2D are section views illustrating the process of production. This embodiment deals with a semiconductor laser device.

Figure 2A:
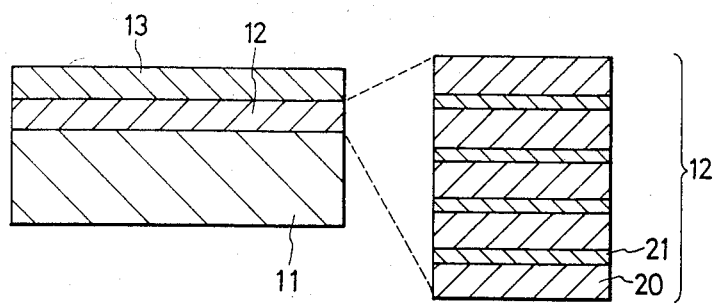
FIGS. 2A to 2D are section views illustrating the steps for producing the laser device of FIG. 1.

First, as shown in FIG. 2A, a first superlattice layer (modulation doped layer) 12 and an undoped GaAs layer 13 (1 $\mu$m) are successively grown by the MBE method on a semi-insulating GaAs substrate 11. As shown in detail in a partly enlarged diagram, the first superlattice layer (modulation doped layer) 12 is formed by alternatingly laminating an undoped $Ga_{0.7}Al_{0.3}As$ layer (120 angstroms) 20 which is a second semiconductor layer and a $Ga_{0.7}Al_{0.3}As$ layer (60 angstroms) 21 which is a first semiconductor layer doped with zinc to have a high impurity concentration.

Figure 2B:
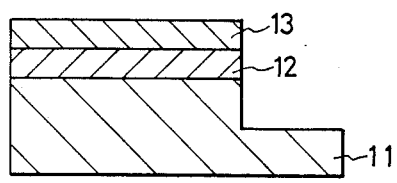

Next, as shown in FIG. 2B, the layers are partly removed by dry etching from the surface of the undoped GaAs layer 13, through the first superlattice layer 12 up into the substrate 11 to form a step having a vertical side wall.

Figure 2C:
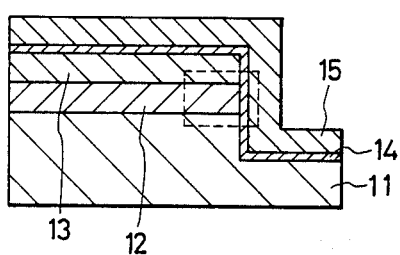

Thereafter as shown in FIG. 2C, monoatomic layers GaAs/$Ga_{0.7}Al_{0.3}As$ are laminated by the MBE method each in an amount of five periods to form a second superlattice layer (30 angstroms) 14 and an n-$Ga_{0.7}Al_{0.3}As$ layer 15 to cover the stepped portion having the side walls from the surface of the undoped GaAs layer 13.

Figure 2D:
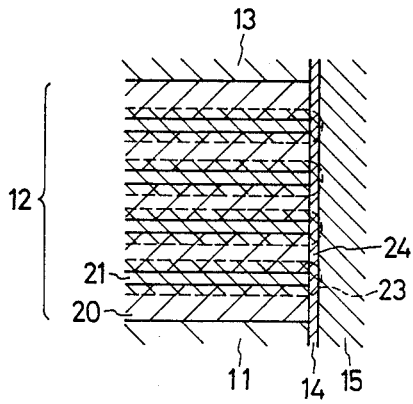

Then, as shown in FIG. 2D, the element substrate is placed under a high-temperature condition (preferably at 550° to 680° C.) so that the impurities Zn are diffused from the first semiconductor layer 21 to the outside by 40 angstroms, in order to disorder part of the second superlattice layer in the vicinity of the first semiconductor layer 21 thereby to form a quantum wire 24 that is sandwiched between one disordered region 23 and another adjacent disordered region 23. FIG. 2D illustrates on an enlarged scale a region that is surrounded by a broken line in FIG. 2C.

Next, a groove 17 in FIG. 1 is formed by etching from the second superlattice on the surface of the element to reach the undoped GaAs layer 13, so that there will flow no current that does not contribute to laser oscillation. Then, zinc is diffused from part of the surface of the n-Ga$_{0.7}$Al$_{0.3}$As layer 15 down to the substrate 11, in order to form a zinc-diffused region 16.

Finally, Ti-Mo-Au is evaporated onto the surface of the zinc-diffused region 16 to form a p-type electrode 18, and AuGeNi-Cr-Au is evaporated on the surface of the second superlattice layer that covers the side surfaces of the step to form an n-type electrode 19, thereby to obtain a semiconductor laser device as shown in FIG. 1.

According to the above embodiment, the threshold current is 0.1 to 0.5 mA, the characteristic temperature is 400° K., and the relaxation oscillation frequency reaches 40 GHz, which are greatly improved characteristics compared with those of the conventional double heterostructure laser and the quantum well laser.

According to the present invention, furthermore, side walls of the first superlattice layer may be exposed by cleavage instead of etching.

EMBODIMENT 2

This embodiment deals with a light-emitting diode to which the present invention is adapted.

Figure 3A:
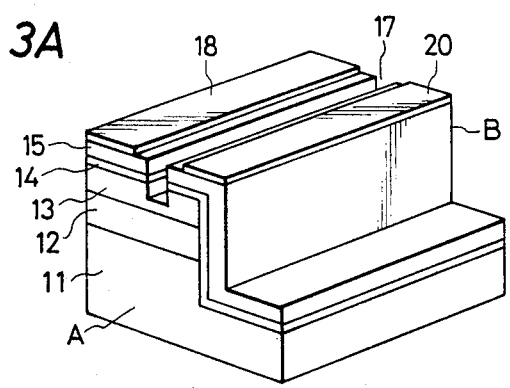
FIG. 3A is a perspective view illustrating a method of producing a light-emitting diode according to a second embodiment of the present invention.

The procedure is carried out in the same manner as in Embodiment 1 through up to the step of forming the p-type electrode 18. Then, an n-type electrode 20 is formed on only the Ga$_{0.7}$Al$_{0.3}$As layer 15 on the stepped portion (FIG. 3A). Then, SiO$_2$ is deposited maintaining a thickness of λ/4 on the opposing two surfaces A and B to form an AR (antireflection) coating film 21.

Figure 3B:
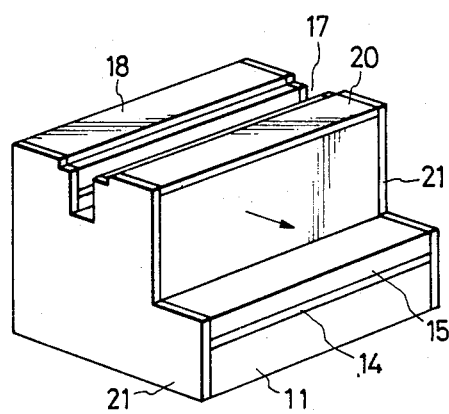
FIG. 3B is a perspective view illustrating the structure of the light-emitting diode according to the second embodiment of the present invention.

A light-emitting diode shown in FIG. 3B is fabricated through the above-mentioned steps. In FIG. 3B, arrow indicates the direction in which the light will be emitted. According to this embodiment, there is obtained a light-emitting diode having good efficiency and good temperature characteristics.

EMBODIMENT 3

Figure 4A:
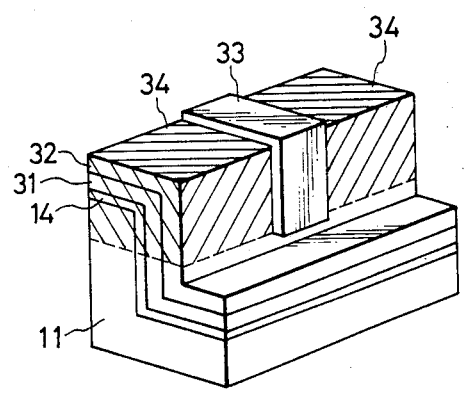
FIG. 4A is a perspective view illustrating the method of producing a transistor according to a third embodiment of the present invention.

This embodiment deals with a high-mobility transistor to which the present invention is adapted. The procedure is carried out in the same manner as in Embodiment 1 up to the step of forming a second superlattice layer 14. Then, an undoped Ga$_{0.7}$Al$_{0.3}$As layer (0.1 μm) 31 and an undoped GaAs layer (0.1 μm) 32 are formed. The device is then placed under a high-temperature condition to form quantum wires 24 in the same manner as in the Embodiment 1. Then, a Ti/Pt/Au gate electrode (gate length, 0.5 μm) 33 is formed. Using the gate electrode as a mask, silicon ions are injected to form an n+type region 34 (FIG. 4A). Thereafter, AuGe/Au source electrode 35 and drain electrode 36 are formed on the GaAs layer 32.

Figure 4B:
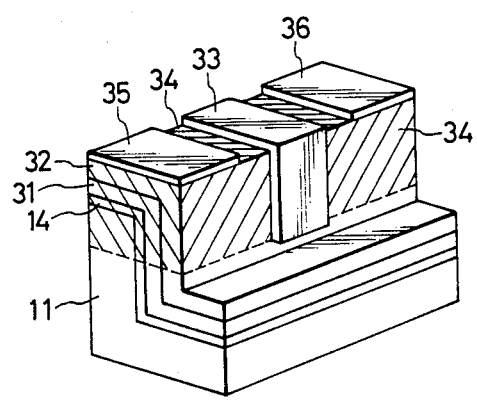
FIG. 4B is a perspective view illustrating the structure of the transistor according to the third embodiment of the present invention.

The quantum wire FET shown in FIG. 4B is thus fabricated through the above-mentioned method, featuring a mutual conductance $g_m$ of about 400 mS per 1 μm of gate width at room temperature, which is 2 to 4 times as great as that of the conventional GaAs MESFET ($g_m$ is about 100 mS) or HEMT ($g_m$ is about 200 mS).

I claim:

1. A semiconductor device comprising:
   (a) a first superlattice layer formed on a semiconductor substrate; and
   (b) a second superlattice layer which covers at least the side walls of said first superlattice layer;
   wherein said first superlattice layer is comprised of at least a first semiconductor layer containing impurities and a second semiconductor layer containing impurities at a concentration lower than that of said first semiconductor layer, and wherein a disordered region is formed in said second superlattice layer in the vicinity of said first semiconductor layer of said first superlattice layer.

2. A semiconductor device according to claim 1, wherein said second superlattice layer is formed on a stepped portion at which said first superlattice layer and part of said semiconductor substrate are exposed.

3. A semiconductor device according to claim 2, wherein said exposure is attained by etching.

4. A semiconductor device according to claim 2, wherein said exposure is attained by cleavage.

5. A semiconductor device according to claim 1, wherein said first semiconductor layer consists of a GaAlAs layer doped with zinc at a high concentration, and said second semiconductor layer consists of an undoped GaAlAs layer.

6. A semiconductor device according to claim 1, wherein said second superlattice layer consists of a GaAs/GaAlAs monoatomic layer superlattice.

7. A semiconductor device according to claim 1, wherein said disordered region is formed by the diffusion of impurities from said first semiconductor layer into said second superlattice layer by the heat treatment at a high temperature.

* * * * *